(12) United States Patent
Torpey (10) Patent No.: US 12,494,770 B2
(45) Date of Patent: Dec. 9, 2025

(54) ACOUSTIC RESONATOR FILTER SYSTEM

(71) Applicant: Matthew S. Torpey, Ellicott City, MD (US)

(72) Inventor: Matthew S. Torpey, Ellicott City, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 291 days.

(21) Appl. No.: 18/181,718

(22) Filed: Mar. 10, 2023

(65) Prior Publication Data
US 2023/0299743 A1 Sep. 21, 2023

Related U.S. Application Data (60) Provisional application No. 63/321,088, filed on Mar. 17, 2022.

(51) Int. Cl.
 *H03H 9/54* (2006.01)
 *H03H 7/00* (2006.01)
 *H03H 9/02* (2006.01)

(52) U.S. Cl.
 CPC ............ *H03H 9/542* (2013.01); *H03H 7/004* (2013.01); *H03H 9/02976* (2013.01); *H03H 2009/02165* (2013.01)

(58) Field of Classification Search
 CPC .... H03H 9/542; H03H 9/205; H03H 9/02007; H03H 2009/02188; H03H 2009/02196; H03H 2009/02204; H03J 7/04; H03J 7/08
 (Continued)

(56) References Cited

U.S. PATENT DOCUMENTS 3,626,300 A * 12/1971 Kennedy .................. H03D 7/18
                                                        455/197.1
4,583,244 A *  4/1986 Ecklund .................... H03J 7/08
                                                        381/15

(Continued)

FOREIGN PATENT DOCUMENTS

CN    107306120 A    10/2017
JP   2008028732 A    2/2008
(Continued)

OTHER PUBLICATIONS

R. S. Howell et al., "The Super-Lattice Castellated Field Effect Transistor (SLCFET): A novel high performance Transistor Topology Ideal for RF switching," 2014 IEEE Int'l Electron Devices Meeting, San Francisco, CA, USA, 2014, pp. 11.5.1-11.5.4 (Year: 2014).*

(Continued)

*Primary Examiner* — Andrea Lindgren Baltzell
*Assistant Examiner* — Victor Cole
(74) *Attorney, Agent, or Firm* — Tarolli, Sundheim, Covell & Tummino LLP (57) ABSTRACT

One example includes an acoustic resonator filter system. The system includes a plurality of filter blocks. Each of the filter blocks can include a plurality of tunable filter elements. Each of the tunable filter elements can include an acoustic resonator. The system also includes a switching network that receives a radio frequency (RF) input signal and provides a filtered RF output signal. The switching network can be (Continued)

configured to selectively switch at least one of the filter blocks in a signal path of the RF input signal to provide the RF output signal.

17 Claims, 4 Drawing Sheets

(58) Field of Classification Search
USPC .................................. 333/187, 193; 455/197
See application file for complete search history.

(56) References Cited

U.S. PATENT DOCUMENTS

| | | | | |
|---|---|---|---|---|
| 5,004,989 | A * | 4/1991 | Hasler | H03B 5/1243 331/117 R |
| 7,522,016 | B2 * | 4/2009 | Toncich | H03H 9/76 333/133 |
| 10,715,112 | B2 | 7/2020 | Nosaka | |
| 2005/0212612 | A1 * | 9/2005 | Kawakubo | H03H 9/542 331/117 R |
| 2008/0013637 | A1 | 1/2008 | Kodama et al. | |
| 2014/0354512 | A1 * | 12/2014 | Kadota | H03H 9/542 343/904 |
| 2016/0065165 | A1 * | 3/2016 | Kadota | H03H 9/542 333/174 |
| 2016/0126922 | A1 * | 5/2016 | Leipold | H01F 27/2804 333/132 |
| 2016/0164481 | A1 | 6/2016 | Madan et al. | |
| 2016/0294357 | A1 * | 10/2016 | Tani | H03H 9/542 |
| 2016/0359466 | A1 | 12/2016 | Schmidhammer | |
| 2017/0288045 | A1 | 10/2017 | Nechay et al. | |
| 2021/0099151 | A1 | 4/2021 | Burgener et al. | |
| 2022/0069786 | A1 | 3/2022 | Jia et al. | |
| 2022/0077848 | A1 | 3/2022 | Yu et al. | |

FOREIGN PATENT DOCUMENTS

| | | |
|---|---|---|
| JP | 2010098593 A | 4/2010 |
| JP | 20170508385 A | 3/2017 |
| TW | 201909552 A | 3/2019 |
| WO | 2015128004 A1 | 9/2015 |

OTHER PUBLICATIONS

International Search Report and Written Opinion for corresponding PCT/US2023/014980, dated Jun. 20, 2023, pp. 1-14.
Hock Lim et al., "A study on tunable bulk acoustic wave macro resonators", In: 2016 IEEE Region 10 Conference (TENCON), Feb. 9, 2017, pp. 1773-1776.
TW Office Action: for corresponding Taiwan application No. 112109712, issued Oct. 25, 2023.
SESR "Supplementary European Search Report" issued Aug. 1, 2025 for corresponding European application No. EP23771261.
Chenetal: "Aluminum Nitride Combined Overtone Resonators for the 5G High Frequency Bands"; Journal of Microelectromechanical Systems, IEEE Service Center, US, vol. 29, No. 2, Apr. 1, 2020 (Apr. 1, 2020), pp. 148-159, XP011781364, ISSN: 1057-7157, DOI: 10.1109/JMEMS.2020.2975557 [retrieved on Apr. 1, 2020] * the whole document *.
Parkeetal: "High-Performance SLCFETs for Switched Filter Applications", 2016 IEEE Compound Semiconductor Integrated Circuit Symposium (CSICS), IEEE, Oct. 23, 2016 (Oct. 23, 2016), pp. 1-4, XP033004573, DOI: 10.1109/CSICS.2016.7751044 [retrieved on Nov. 21, 2016] * the whole document *.
Npl_Hocketal: "A study on tunable bulk acoustic wave macro resonators", 2016 IEEE Region 10 Conference (TENCON), IEEE, Nov. 22, 2016 (Nov. 22, 2016), pp. 1773-1776, XP033062536, DOI: 10.1109/TENCON.2016.7848324 [retrieved on Feb. 8, 2017] * the whole document *.
JPOA: "Office Action" mailed Sep. 2, 2025 for corresponding JP 2024-545162.

* cited by examiner

ACOUSTIC RESONATOR FILTER SYSTEM

CROSS REFERENCE TO RELATED APPLICATION

This application claims priority from U.S. Provisional Patent Application No. 63/321,088, filed 17 Mar. 2022, which is incorporated herein by reference in its entirety.

TECHNICAL FIELD

The present disclosure relates generally to communications, and specifically to an acoustic resonator filter system.

BACKGROUND

Resonator circuits are implemented in a variety of different types of applications, such as to filter ranges of frequencies. A variety of different types of resonators exist. One such type of resonator is an acoustic resonator that implements acoustic waves on an integrated circuit (IC). Acoustic resonators include bulk acoustic wave (BAW) resonators and standing acoustic wave (SAW) resonators. Acoustic wave resonators are designed to provide confinement of the acoustic energy in the resonator to increase quality factor (Q) of the resonator. As an example, conventional acoustic resonators can provide for effective filtering in a narrow band about a center frequency (e.g., +/- approximately 5 dB).

One example includes an acoustic resonator filter system. The system includes a plurality of filter blocks. Each of the filter blocks can include a plurality of tunable filter elements. Each of the tunable filter elements can include an acoustic resonator. The system also includes a switching network that receives a radio frequency (RF) input signal and provides a filtered RF output signal. The switching network can be configured to selectively switch at least one of the filter blocks in a signal path of the RF input signal to provide the RF output signal.

Another example includes a method for filtering an RF input signal via an acoustic resonator filter system. The method includes providing the RF input signal to a switching network of the acoustic resonator filter system and providing a plurality of switching signals to the switching network to selectively switch at least one of a plurality of filter blocks in a signal path of the RF input signal. Each of the filter blocks can include a plurality of tunable filter elements. Each of the tunable filter elements can include an acoustic resonator. The method further includes providing an RF output signal at an output of the switching network. The RF output signal can correspond to the RF input signal being provided through the selectively switched filter blocks in the signal path.

Another example includes an integrated circuit (IC) comprising an acoustic resonator filter system. The acoustic resonator filter system can include a plurality of filter blocks. Each of the filter blocks can include a plurality of tunable filter elements. Each of the tunable filter elements can include an acoustic resonator in parallel with a capacitive network. The capacitive network can include a varactor. The method further includes a switching network that can receive an RF input signal and can provide a filtered RF output signal. The switching network can be configured to selectively switch at least one of the filter blocks in a signal path of the RF input signal to provide the RF output signal.

DETAILED DESCRIPTION

The present disclosure relates generally to communications, and specifically to an acoustic resonator filter system. The acoustic resonator filter system can be implemented in any of a variety of communications systems, such as in a transmit and/or a receive path of a wireless transceiver. The acoustic resonator filter system includes a plurality of filter blocks. Each of the filter blocks includes a plurality of tunable filter elements that each include an acoustic resonator and a capacitive network. As an example, the acoustic resonator can be configured as a combined overtone resonator (COR). As another example, the capacitive network can include a varactor, such as provided in parallel with the acoustic resonator and in parallel with a static capacitance capacitor, to provide the tunability of the tunable filter elements. The varactor can be provided a control voltage to set the capacitance of the tunable filter elements of each of the filter blocks.

The acoustic resonator filter system also includes a switching network that is configured to receive switching signals to selectively switch one or more of the filter blocks in a signal path of a radio frequency (RF) input signal to provide an RF output signal. The switching network can include sets of super lattice castellated gate field effect transistor (SLCFET) switches to accommodate a large range of frequencies of the RF input signal. Each set of switches can thus either provided a bypass node in the signal path of the RF input signal in a first state or a respective one of the filter blocks in the signal path of the RF input signal in a second state. The switching network can thus be implemented responsive to the switching signals to selectively provide one or more different filter blocks in the signal path of the RF input signal.

Figure 1:
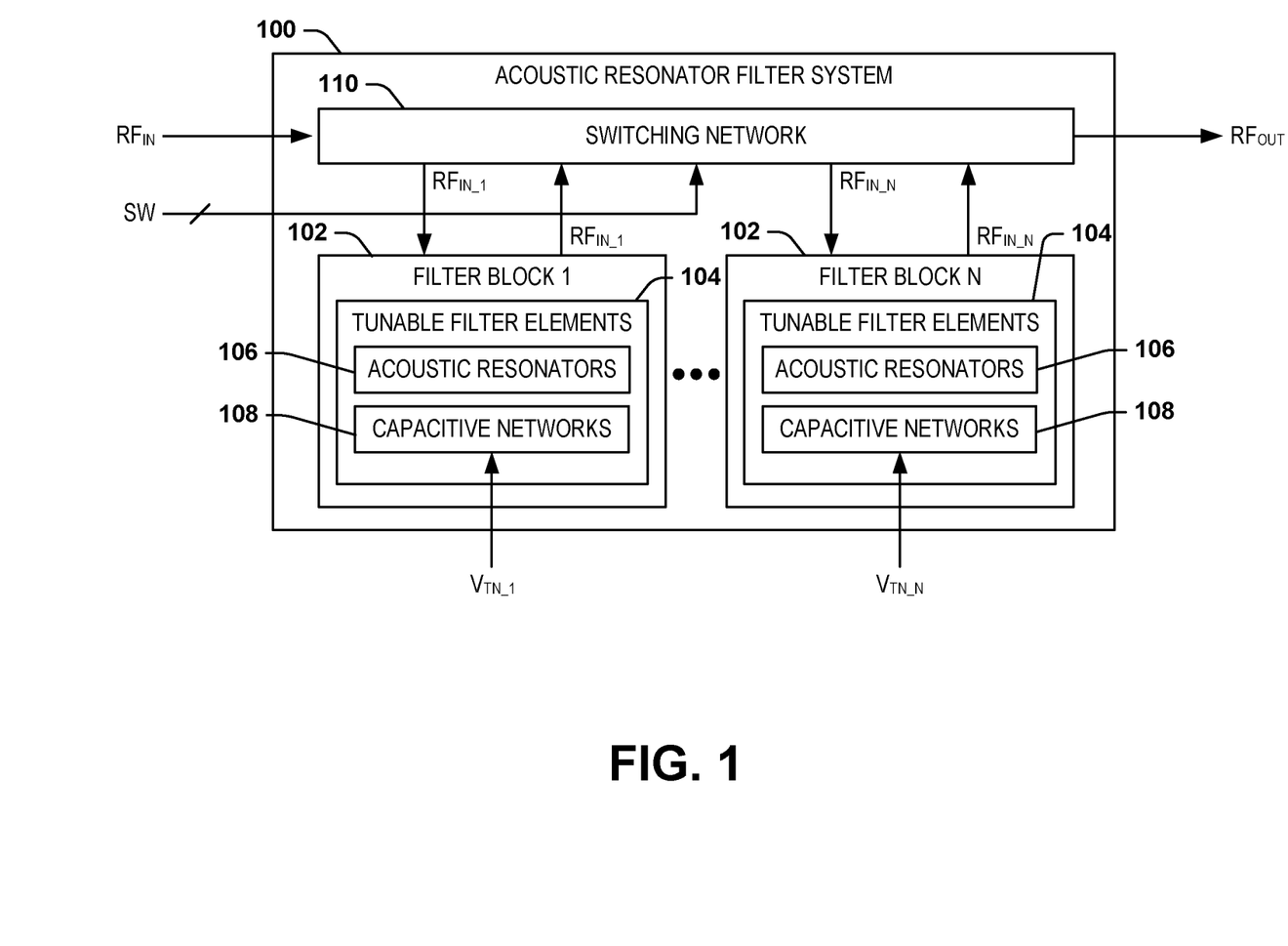
FIG. 1 illustrates an example block diagram of an acoustic resonator filter system.

FIG. 1 illustrates an example block diagram of an acoustic resonator filter system 100. The acoustic resonator filter system can be implemented in any of a variety of communications systems, such as in a transmit and/or a receive path of a wireless transceiver. As described herein, the acoustic resonator filter system can provide passband filtering of a radio frequency (RF) input signal, demonstrated in the example of FIG. 1 as a signal $RF_{IN}$, across a large bandwidth of a broad spectrum.

The acoustic resonator filter system includes a plurality N of filter blocks 102, where N is a positive integer. Each of the filter blocks 102 includes a plurality of tunable filter elements 104. In the example of FIG. 1, each of the tunable filter elements 104 includes an acoustic resonator 106 and a capacitive network 108. As an example, the acoustic resonator 106 can be configured as a combined overtone resonator (COR), and the capacitive network 108 can include a varactor. In the example of FIG. 1, the capacitive network 108 of each of the tunable filter elements 104 is provided a control voltage, demonstrated as a voltage $V_{TN\_1}$ through $V_{TN\_N}$ provided to the respective N filter blocks 102. The control voltages $V_{TN\_1}$ through $V_{TN\_N}$ can thus set the capacitance of the varactor of the capacitive network 108 of each of the tunable filter elements 104. As an example, the varactor of the capacitive network 108 can be provided in parallel with the acoustic resonator 106 and in parallel with a static capacitance capacitor.

As an example, each of the tunable filter elements 104 can be fabricated approximately the same, and can number the same in quantity in each of the filter blocks 102. Therefore, the control voltages $V_{TN\_1}$ through $V_{TN\_N}$ can provide tunability of the tunable filter elements 104, and thus tunability of each of the filter blocks 102. As a first example, the control voltages $V_{TN\_1}$ through $V_{TN\_N}$ can each have distinct amplitudes to provide a different capacitance of the capacitive networks 108 of the tunable filter elements 104 relative to each other. As a second example, the control voltages $V_{TN\_1}$ through $V_{TN\_N}$ can each be approximately equal in amplitude, such that the filter characteristics of the acoustic resonator filter system 100 can be set based on selectively providing the filter blocks 102 in a signal path of the RF input signal, as described in greater detail herein. As a third example, the control voltages $V_{TN\_1}$ through $V_{TN\_N}$ can each represent a set of different amplitude voltages to provide an even greater tunability of each of the capacitive networks 108 in each of the tunable filter elements 104. The control voltages $V_{TN\_1}$ through $V_{TN\_N}$ can be static or programmable to provide an even greater control of the filter characteristics of the acoustic resonator filter system 100.

The acoustic resonator filter system 100 also includes a switching network 110 that is configured to receive the RF input signal $RF_{IN}$ and provide an RF output signal $RF_{OUT}$ corresponding to the filtered RF input signal as an output. The switching network 110 is controlled by a set of switching signals SW to selectively switch one or more of the filter blocks 102 in a signal path of the RF input signal $RF_{IN}$ to provide the RF output signal $RF_{OUT}$. Each set of switches of the switching network 110 can thus either provided a bypass node in the signal path of the RF input signal $RF_{IN}$ in a first state or a respective one of the filter blocks 102 in the signal path of the RF input signal $RF_{IN}$ in a second state.

In the example of FIG. 1, a given one of the filter blocks 102 can be provided as part of the signal path of the RF input signal $RF_{IN}$ based on the RF input signal $RF_{IN}$ traversing through the respective filter block 102, as demonstrated by a signal $RF_{IN\_1}$ through $RF_{IN\_N}$ traversing through the respective filter blocks 102. As an example, the switching network 110 can include sets of super lattice castellated gate field effect transistor (SLCFET) switches to accommodate a large range of frequencies of the RF input signal $RF_{IN}$. The switching network can thus be implemented responsive to the switching signals SW to selectively provide one or more different filter blocks in the signal path of the RF input signal $RF_{IN}$ to set selective filtering characteristics of the RF input signal $RF_{IN}$ to provide the RF output signal $RF_{OUT}$.

Based on the arrangement of the filter blocks 102 composed of the tunable filter elements 104, the acoustic resonator filter system 100 can exhibit superior filtering characteristics for the RF input signal $RF_{IN}$ relative to conventional filter systems that implement acoustic resonators. For example, a typical filter system that implements an acoustic resonator can achieve a bandwidth of less than 5%. However, the acoustic resonator filter system 100 can operate at high frequencies, such as up to approximately 40 GHz of the RF input signal $RF_{IN}$, and with a variable bandwidth and tuning range of up to approximately 33% of the center frequency. As an example, the acoustic resonator filter system 100 can be fabricated on an integrated circuit (IC) having a significantly smaller form-factor relative to conventional acoustic resonator filters. Furthermore, based on the selective tuning of the capacitive network 108 in each of the tunable filter elements, as well as the selective switching of the filter blocks 102 in the signal path of the RF input signal $RF_{IN}$, the acoustic resonator filter system 100 can operate as any of a band-pass, low-pass, high-pass, or notch filter having highly variable filter characteristics.

Figure 2:
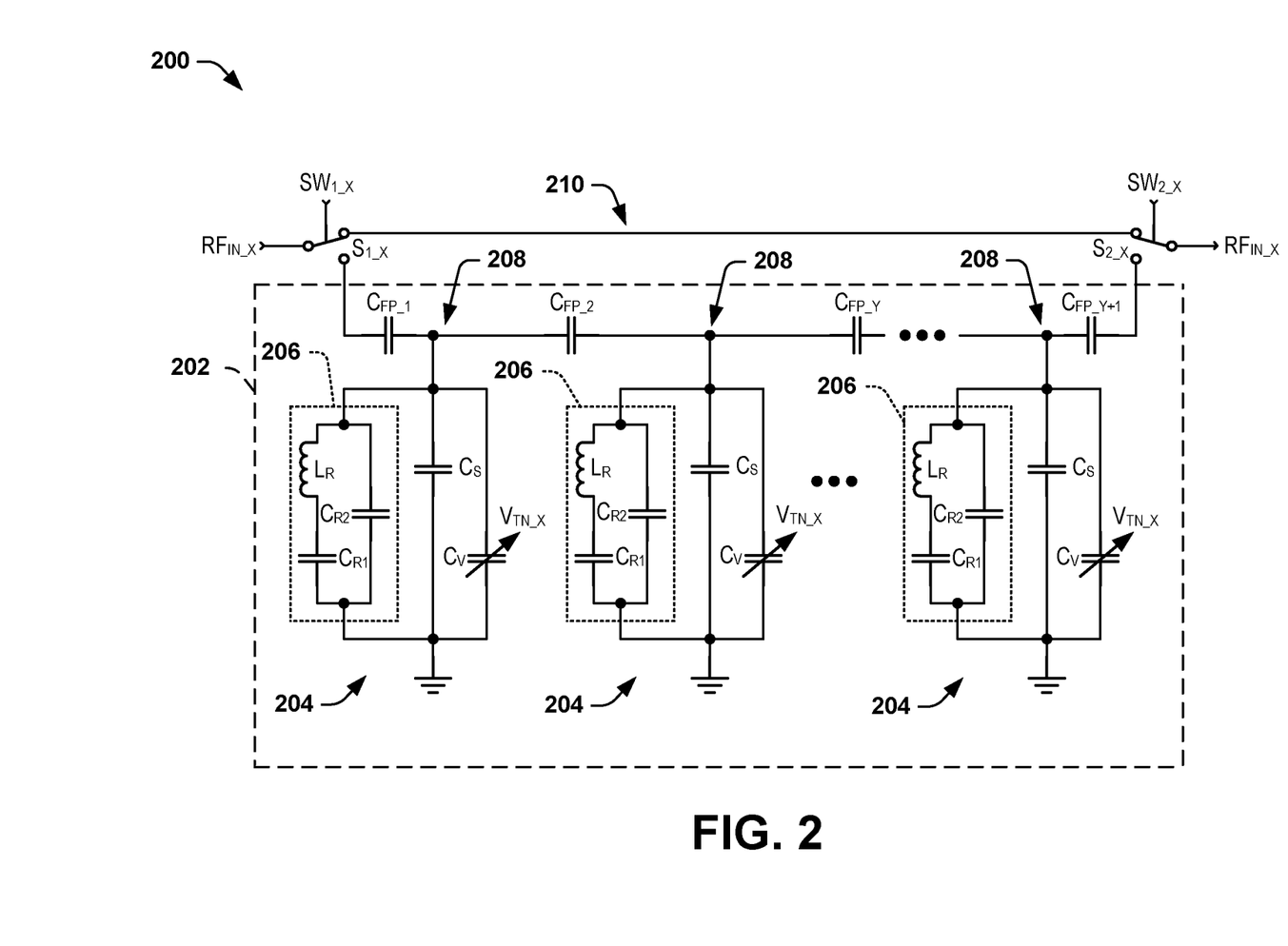
FIG. 2 illustrates an example diagram of a filter block.

FIG. 2 illustrates an example diagram 200 of a filter block 202. The filter block 202 can correspond to any one of the filter blocks 102 in the example of FIG. 1. As described in greater detail herein, the filter block 202 can correspond to the Xth one of the N filter blocks 102. Therefore, reference is to be made to the example of FIG. 1 in the following description of the example of FIG. 2.

The filter block 202 includes a plurality Y of tunable filter elements 204, where Y is a positive integer. Each of the tunable filter elements 204 includes an acoustic resonator 206, a capacitor $C_S$, and a variable capacitor (varactor) $C_V$ arranged in parallel. The acoustic resonator 206 is demonstrated in the example of FIG. 2 as including a first capacitor $C_{R1}$ and an inductor $L_R$ arranged in series, with the series arrangement of the first capacitor $C_{R1}$ and the inductor $L_R$ being arranged in parallel with a second capacitor $C_{R2}$. The circuit arrangement of the acoustic resonator 206 can be representative of operational characteristics of the acoustic resonator 206. For example, the values of the first capacitor $C_{R1}$, the second capacitor $C_{R2}$, and the inductor $L_R$ can be based on physical characteristics (e.g., substrate dimensions) of the acoustic resonator 206. The capacitors $C_S$ and $C_V$ can correspond to the capacitive network 108 in the example of FIG. 1.

As an example, the acoustic resonator 206 can be configured as a COR (e.g., an aluminum nitride (AlN) COR). Therefore, the acoustic resonators 206 can exhibit a high quality factor (Q) at frequencies both above and below a given range of frequencies of the RF input signal $RF_{IN}$ (e.g., Ka-band). For example, the CORs can operate at a Q between approximately 400 and approximately 1000. Additionally, the acoustic resonators 206 configured as CORs can provide a shape factor selectivity of approximately 1.03 to provide significant out-of-band and interference rejection of the RF input signal $RF_{IN}$. Such a selectivity can achieve a rejection of approximately 60 dB at approximately 50 MHz on either side of a 3.5 GHz bandwidth, thus providing a significantly greater rejection characteristic of conventional acoustic resonator filters (e.g., exhibiting a selectivity of approximately 1.5).

The parallel arrangement of the acoustic resonator 206, the capacitor $C_S$, and the varactor $C_V$ can provide for significantly improved filter characteristics over conventional filters. The varactor $C_V$ in each of the tunable filter elements 204 is demonstrated as receiving a control voltage $V_{TN\_X}$ to set a capacitance for the varactors $C_V$. As an example, the control voltage $V_{TN\_X}$ can be approximately the same amplitude for each of the tunable filter elements 204 in the filter block 202. As another example, the control voltages $V_{TN\_X}$ can vary between the tunable filter elements 204 in the filter block 202.

For example, the split capacitance provided by the capacitors $C_S$ and $C_V$ in parallel with the acoustic resonator 206 can provide for the ability to continuously tune of the tunable filter element 204 over a broad frequency range with minimal impact to quality factor Q and insertion loss. As an example, the varactor $C_V$ can be configured as a barium strontium titanate (BST) varactor, thus enabling a tuning range of up to approximately 33% with a loss tangent of approximately 0.006 and a quality factor Q of approximately 40 at a frequency of approximately 18 GHz. Therefore, the split capacitor arrangement of the capacitors $C_S$ and $C_V$ in parallel with the acoustic resonator 206 can provide for a large range of frequency tuning without providing performance degradation of the acoustic resonator filter system 100.

As an example, while the acoustic resonator 206 can be formed in the substrate of the associated IC on which the acoustic resonator filter system 100 is fabricated, the capacitors $C_S$ and $C_V$ can be arranged as surface-mounted components of the associated IC. For example, the associated IC can be fabricated in a flip-chip fabrication design to minimize a path length between the acoustic resonators 206 and the capacitors $C_S$ and $C_V$. Therefore, insertion losses associated with the RF input signal $RF_{IN}$ can be mitigated in each of the filter blocks 102. For example, the insertion losses can vary as a percentage of the bandwidth of the acoustic resonator filter system 100, such as approximately 5 dB for 3% bandwidth and approximately 2.5 dB for wider bandwidths. As an alternative example, the acoustic resonator 206 and the capacitors $C_S$ and $C_V$ can be fabricated in a common substrate fabrication design.

In the example of FIG. 2, each of the tunable filter elements 204 is arranged between a filter-path node 208 and a low-voltage rail, demonstrated in the example of FIG. 2 as ground. Each of the filter-path nodes 208 interconnects a pair of filter-path capacitors, demonstrated in the example of FIG. 2 as capacitors $C_{FP\_1}$ through $C_{FP\_Y+1}$ for the set of Y tunable filter elements. Therefore, the filter-path capacitors $C_{FP\_1}$ through $C_{FP\_Y+1}$ number one greater in quantity than the Y tunable filter elements 204. The filter-path nodes 208 and the filter-path capacitors $C_{FP\_1}$ through $C_{FP\_Y+1}$ are arranged between a first switch $S_{1\_X}$ and a second switch $S_{2\_X}$. The switches $S_{1\_X}$ and $S_{2\_X}$ can correspond to a single set of switches in the switching network 110 that are controlled, respectively, by a pair of switching signals $SW_{1\_X}$ and $SW_{2\_X}$, respectively.

The first switch $S_{1\_X}$ receives the RF input signal as an input and the second switch $S_{2\_X}$ provides the RF input signal as an output. In the example of FIG. 2, the RF input signal $RF_{IN}$ is demonstrated as a signal $RF_{IN\_X}$, which is representative of the filtering effects of the Xth filter block 202 on the RF input signal $RF_{IN}$. In a first state, the switching signals $SW_{1\_X}$ and $SW_{2\_X}$ can set each of the respective switches $S_{1\_X}$ and $S_{2\_X}$ to couple to each other via a bypass node 210. Therefore, in the first state, the switches $S_{1\_X}$ and $S_{2\_X}$ provide the bypass node as part of the signal path of the RF input signal $RF_{IN}$. Accordingly, the tunable filter elements 204 are bypassed completely in the first state of the switches $S_{1\_X}$ and $S_{2\_X}$, such that the tunable filter elements 204 provide no filtering effects on the RF input signal $RF_{IN}$ in the first state of the switches $S_{1\_X}$ and $S_{2\_X}$.

In a second state, the switching signals $SW_{1\_X}$ and $SW_{2\_X}$ can set each of the respective switches $S_{1\_X}$ and $S_{2\_X}$ to couple to the series arrangement of the filter-path nodes 208 and the filter-path capacitors $C_{FP\_1}$ through $C_{FP\_Y+1}$. Therefore, in the second state, the switches $S_{1\_X}$ and $S_{2\_X}$ provide the filter block 202 as part of the signal path of the RF input signal $RF_{IN}$. Accordingly, the tunable filter elements 204 provide filtering effects of the RF input signal $RF_{IN}$ in the second state of the switches $S_{1\_X}$ and $S_{2\_X}$ based on the variable tuning of the varactors $C_V$ in response to the control voltages $V_{TN\_X}$.

The filter block 202 can correspond to a single filter block 102 of the acoustic resonator filter system 100. Therefore, based on the sets of switching signals SW provided to the switching network 110, each of the filter blocks 102 can be selectively set to provide one of a bypass node and the tunable filter elements 104 as part of the signal path of the RF input signal RF in the same manner as described above for the filter block 202 in the example of FIG. 2. Therefore, the filter blocks 102 can each be selectively provided as part of the signal path of the RF input signal $RF_{IN}$ to provide a collective contribution to the filtering of the RF input signal $RF_{IN}$ based on the both the independent filter characteristics of the filter blocks 102 and/or based on the quantity of the filter blocks 102 provided in the signal path of the RF input signal $RF_{IN}$ to provide the filtered RF output signal $RF_{OUT}$.

Figure 3:
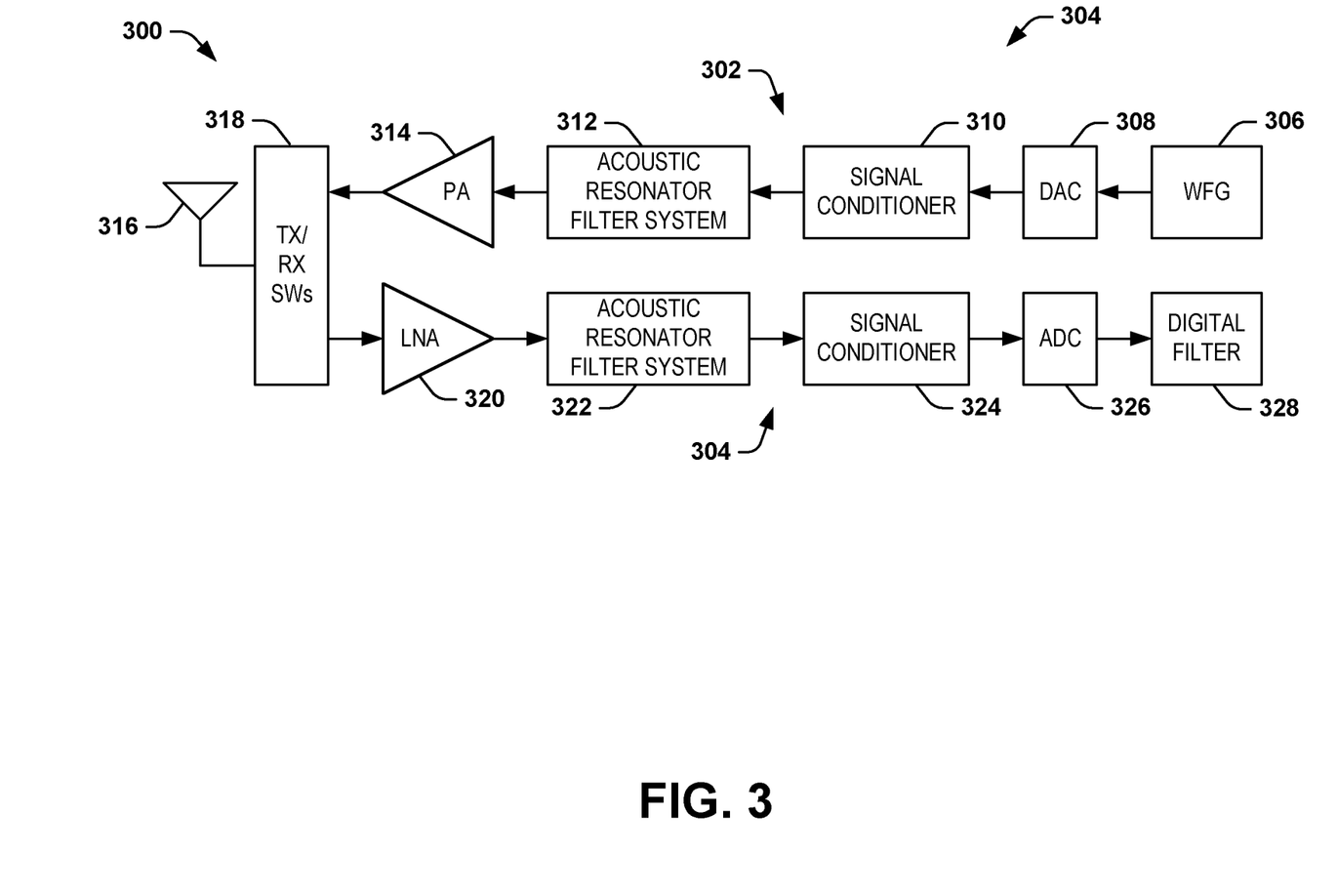
FIG. 3 illustrates an example of a communications transceiver system.

FIG. 3 illustrates an example of a communications transceiver system 300. The communications transceiver system 300 can be implemented in any of a variety of wireless communications systems that may communicate at high frequency and with a broad frequency band.

The communications transceiver system 300 includes a transmit path 302 and a receive path 304. The transmit path 302 includes a digital waveform generator (WFG) 306 that is configured to generate a digital signal. The digital signal is provided to a digital-to-analog converter (DAC) 308 that is configured to convert the digital signal to an analog signal. The analog signal is provided to a signal conditioner 310 that is configured to provide signal conditioning (e.g., amplification, attenuation, analog processing, etc.) on the analog signal. The conditioned analog signal is provided to an acoustic resonator filter system 312. The acoustic resonator filter system 312 can be configured substantially similar to the acoustic resonator filter system 100 in the example of FIG. 1. Therefore, the acoustic resonator filter system 312 can include a plurality of filter blocks that are each arranged similar to the filter block 202 in the example of FIG. 2. Accordingly, the acoustic resonator filter system 312 can provide a highly tunable and effective filtering of the conditioned analog signal. The filtered and conditioned analog signal is provided to a power amplifier (PA) 314 for amplification before being transmitted from an antenna 316 in a transmission mode set by a TX/RX switching system 318.

The receive path 304 includes a low-noise amplifier (LNA) 320 that receives and amplifies an analog receive signal from the antenna 316 via the TX/RX switching system 318 in the receive mode. The amplified analog signal is provided to an acoustic resonator filter system 322 that can also be configured substantially similar to the acoustic resonator filter system 100 in the example of FIG. 1. Therefore, the acoustic resonator filter system 322 can include a plurality of filter blocks that are each arranged similar to the filter block 202 in the example of FIG. 2. Accordingly, the acoustic resonator filter system 322 can provide a highly tunable and effective filtering of the amplified analog receive signal. The filtered analog receive signal is provided to a signal conditioner 324 that is configured to provide signal conditioning (e.g., amplification, attenuation, analog processing, etc.) on the filtered analog receive signal. The conditioned and filtered analog receive signal is provided to an analog-to-digital converter (ADC) 326 that is configured to convert the conditioned and filtered analog receive signal to a digital receive signal. The digital receive signal is thus provided to a digital filter 328 that is configured to process the digital receive signal.

Figure 4:
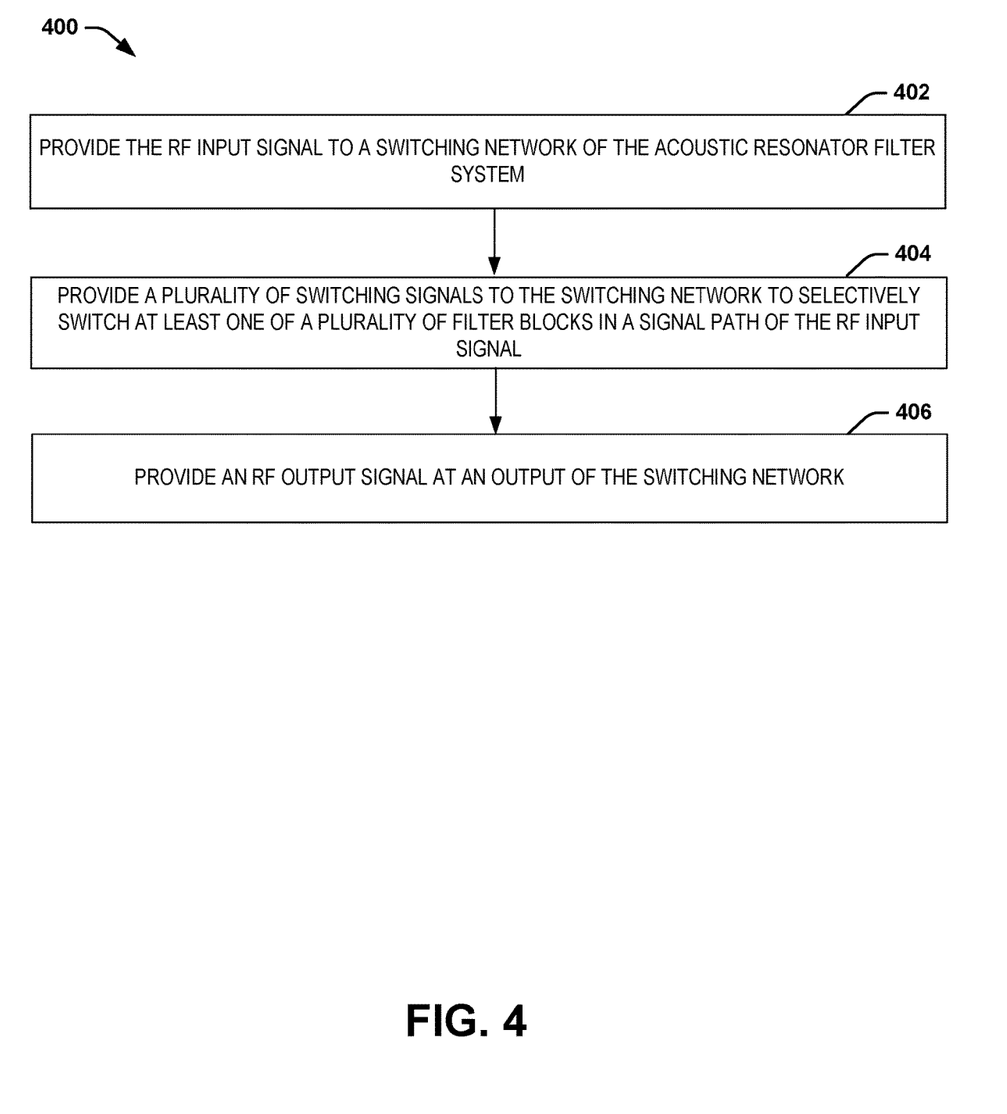
FIG. 4 illustrates an example of a method for filtering an RF input signal via an acoustic resonator filter system.

In view of the foregoing structural and functional features described above, a methodology in accordance with various aspects of the disclosure will be better appreciated with reference to FIG. 4. It is to be understood and appreciated that the method of FIG. 4 is not limited by the illustrated order, as some aspects could, in accordance with the present disclosure, occur in different orders and/or concurrently with other aspects from that shown and described herein. More-over, not all illustrated features may be required to implement a methodology in accordance with an aspect of the present examples.

FIG. 4 illustrates an example of a method 400 for filtering a radio frequency (RF) input signal (e.g., the RF input signal $RF_{IN}$) via an acoustic resonator filter system (e.g., the acoustic resonator filter system 100). At 402, the RF input signal is provided to a switching network (e.g., the switching network 110) of the acoustic resonator filter system. At 404, a plurality of switching signals (e.g., the switching signals SW) are provided to the switching network to selectively switch at least one of a plurality of filter blocks (e.g., the filter blocks 102) in a signal path of the RF input signal. Each of the filter blocks can include a plurality of tunable filter elements (e.g., the tunable filter elements 104). Each of the tunable filter elements can include an acoustic resonator (e.g., the acoustic resonator 106). At 406, an RF output signal (e.g., the RF output signal $RF_{OUT}$) is provided from an output of the switching network. The RF output signal can correspond to the RF input signal being provided through the selectively switched filter blocks in the signal path.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. An acoustic resonator filter system comprising:
    a plurality of filter blocks, each of the filter blocks comprising a plurality of tunable filter elements, each of the tunable filter elements comprising an acoustic resonator, a fixed capacitance capacitor, and a varactor arranged in parallel; and
    a switching network that receives a radio frequency (RF) input signal and provides a filtered RF output signal, the switching network being configured to selectively switch at least one of the filter blocks in a signal path of the RF input signal to provide the RF output signal.

2. An integrated circuit (IC) comprising the acoustic resonator filter system of claim 1.

3. A communications transceiver system comprising a transmit path and a receive path, each of the transmit path and the receive path comprising the acoustic resonator filter system of claim 1.

4. The system of claim 1, wherein the varactor of each of the tunable filter elements is provided a control voltage to set a capacitance for a capacitive network of each of the tunable filter elements.

5. The system of claim 1, wherein the acoustic resonator is arranged as a combined overtone resonator.

6. The system of claim 1, wherein the tunable filter elements are each arranged between a respective plurality of filter-path nodes and a low-voltage rail, wherein each of the filter blocks further comprises a plurality of filter-path capacitors connected between each of the filter-path nodes.

7. The system of claim 6, wherein the switching network is configured to switch each of the filter blocks to provide the signal path through a bypass node in a first state and through the filter-path nodes and filter-path capacitors in a second state.

8. The system of claim 1, wherein the switching network comprises a plurality of super lattice castellated gate field effect transistor (SLCFET) switches configured to selectively switch the at least one of the filter blocks in the signal path of the RF input signal to provide the RF output signal.

9. A method for filtering a radio frequency (RF) input signal via an acoustic resonator filter system, the method comprising:
    providing the RF input signal to a switching network of the acoustic resonator filter system;
    providing a plurality of switching signals to the switching network to selectively switch at least one of a plurality of filter blocks in a signal path of the RF input signal, each of the filter blocks comprising a plurality of tunable filter elements, each of the tunable filter elements comprising an acoustic resonator, a fixed capacitance capacitor, and a varactor arranged in parallel; and
    providing an RF output signal at an output of the switching network, the RF output signal corresponding to the RF input signal being provided through the selectively switched filter blocks in the signal path.

10. The method of claim 9, wherein the acoustic resonator is arranged as a combined overtone resonator.

11. The method of claim 9, wherein the tunable filter elements are each arranged between a respective plurality of filter-path nodes and a low-voltage rail, wherein each of the filter blocks further comprises a plurality of filter-path capacitors connected between each of the filter-path nodes, wherein providing the switching signals comprises providing the switching signals to selectively provide the signal path through a bypass node of a given one of the filter blocks in a first state and through the filter-path nodes and filter-path capacitors of the given one of the filter blocks in a second state.

12. The method of claim 9, wherein providing the switching signals comprises providing the switching signals to each of a plurality of super lattice castellated gate field effect transistor (SLCFET) switches configured to selectively switch the at least one of the filter blocks in the signal path of the RF input signal.

13. An integrated circuit (IC) comprising an acoustic resonator filter system, the acoustic resonator filter system further comprising:
    a plurality of filter blocks, each of the filter blocks comprising a plurality of tunable filter elements, each of the tunable filter elements comprising an acoustic resonator, a fixed capacitance capacitor, and a varactor arranged in parallel; and
    a switching network that receives a radio frequency (RF) input signal and provides a filtered RF output signal, the switching network being configured to selectively switch at least one of the filter blocks in a signal path of the RF input signal to provide the RF output signal.

14. The system of claim 13, wherein the acoustic resonator is arranged as a combined overtone resonator.

15. The system of claim 13, wherein the tunable filter elements are each arranged between a respective plurality of filter-path nodes and a low-voltage rail, wherein each of the filter blocks further comprises a plurality of filter-path capacitors connected between each of the filter-path nodes.

16. The system of claim 15, wherein the switching network is configured to switch each of the filter blocks to provide the signal path through a bypass node in a first state and through the filter-path nodes and filter-path capacitors in a second state.

17. The system of claim 15, wherein the switching network comprises a plurality of super lattice castellated gate field effect transistor (SLCFET) switches configured to selectively switch the at least one of the filter blocks in the signal path of the RF input signal to provide the RF output signal.

* * * * *